US009501042B1

(12) United States Patent
Lee

(10) Patent No.: US 9,501,042 B1
(45) Date of Patent: Nov. 22, 2016

(54) TIMING DEVICE AND METHOD THEREOF

(71) Applicant: MACRONIX INTERNATIONAL CO., LTD., Hsinchu (TW)

(72) Inventor: Ming-Hsiu Lee, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/816,137

(22) Filed: Aug. 3, 2015

(51) Int. Cl.
*G01R 29/02* (2006.01)
*G04F 10/10* (2006.01)

(52) U.S. Cl.
CPC .................................... *G04F 10/10* (2013.01)

(58) Field of Classification Search
None
See application file for complete search history.

(56) References Cited

U.S. PATENT DOCUMENTS 8,634,235 B2 * 1/2014 Lung .................. G11C 13/0004 365/163
9,286,976 B2 * 3/2016 Lin ...................... G11C 13/004
2010/0328995 A1 * 12/2010 Shih ................... G11C 13/0004 365/163

* cited by examiner

*Primary Examiner* — Cassandra Cox
(74) *Attorney, Agent, or Firm* — McClure, Qualey & Rodack, LLP

(57) ABSTRACT

A timing device is provided. The timing device includes a memory device and a processor. The memory device has a first electrical parameter. The processor is configured to sense an initial value of a first electrical parameter of the memory device. The processor is configured to sense a first value of the first electrical parameter of the memory device after a first time period. And the processor is further configured to calculate the first time period according to the initial value of the first electrical parameter and the first value of the first electrical parameter.

20 Claims, 7 Drawing Sheets

TIMING DEVICE AND METHOD THEREOF

BACKGROUND

Technical Field

The disclosure relates in general to a timing device and a timing method.

Description of the Related Art

For electronic circuits, there is a need to calculate the elapsed time of a certain event. A typical method to measure the elapsed time is to use a timing circuit to calculate the time passed. However, the method needs to provide electricity to the timing circuit for continuously counting time. And once the timing circuit is interrupted or suffer from a power loss event, the tracking of the elapsed time will be lost. A further method to prevent the problem caused by the power loss event is to add a battery or a capacitor to keep the time running. However, the system will face similar problems again when the battery is defective or runs out of power, especially when the power loss period extends for a long time. Therefore, there is a desire to provide a new method to obtain the elapsed time without the necessity of supplying electrical power.

SUMMARY

According to the disclosure, a timing device is provided. The timing device includes a memory device and a processor. The memory device has a first electrical parameter. The processor is configured to sense an initial value of a first electrical parameter of the memory device. The processor is configured to sense a first value of the first electrical parameter of the memory device after a first time period. And the processor is further configured to calculate the first time period according to the initial value of the first electrical parameter of the memory device and the first value of the first electrical parameter of the memory device.

According to the disclosure, a timing method using a memory device is provided. The timing method includes the following steps. Sensing an initial value of a first electrical parameter of the memory device. Sensing a first value of the first electrical parameter of the memory device after a first time period. And calculating the first time period according to the initial value of the first electrical parameter of the memory device and the first value of the first electrical parameter of the memory device.

The accompanying drawings, which are incorporated in and constitute a part of this specification, illustrate disclosed embodiments and, together with the description, serve to explain the disclosed embodiments.

DETAILED DESCRIPTION

Figure 1:
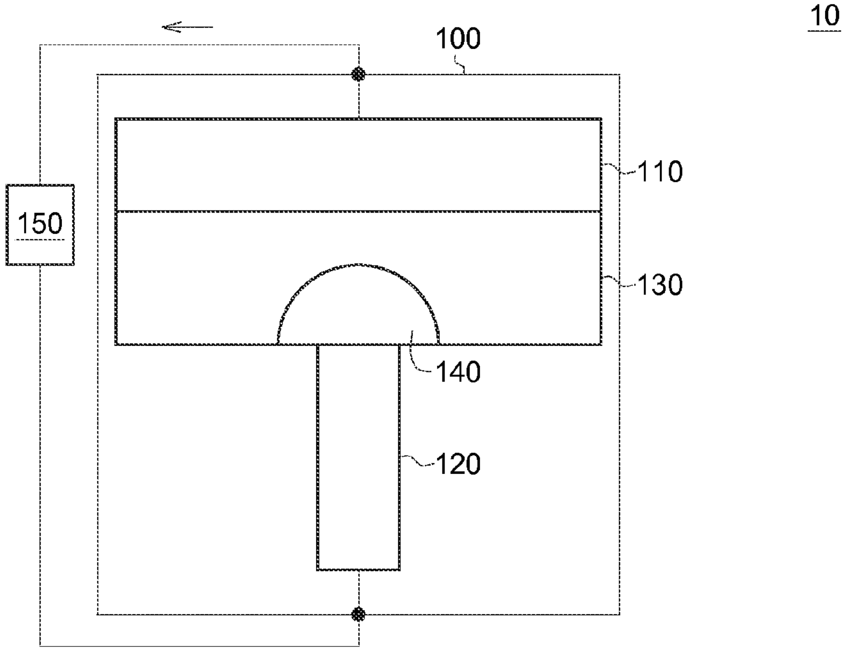
FIG. 1 shows a diagram of a timing device according to a first embodiment of the present disclosure.

In the present disclosure, a timing device and a timing method are provided to avoid loss of elapsed time caused by power loss event. Several embodiments are provided hereinafter with reference to the accompanying drawings for describing the related configurations and procedures. However, the present disclosure is not limited thereto. The identical and/or similar elements of the embodiments are designated with the same or similar reference numerals.

Figure 2:
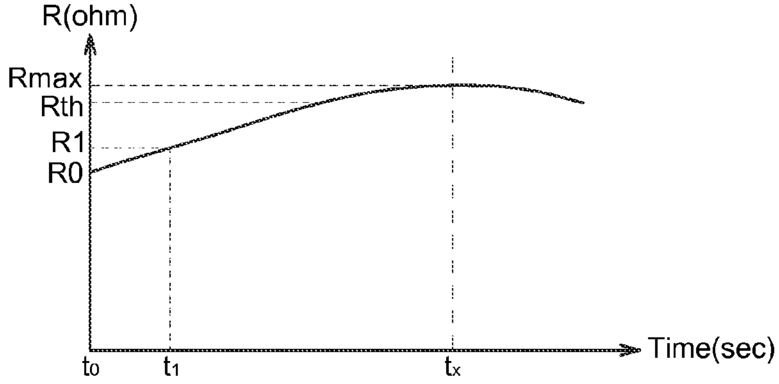
FIG. 2 shows a diagram of resistance of the phase change memory drifting with time according to the first embodiment of the present disclosure.

Please refer to FIG. 1 and FIG. 2. FIG. 1 shows a diagram of a timing device 10 according to a first embodiment of the present disclosure. The timing device 10 includes a memory device 100 and a processor 150. In the first embodiment, the memory device 100 is a phase change memory. And the phase change memory has a first electrical parameter, for example, a resistance. FIG. 2 shows a diagram of resistance of the phase change memory drifting with time according to the first embodiment of the present disclosure. The processor 150 senses the initial resistance value R0 of the memory device 100. And after a first time period, e.g. $t_1$, the processor 150 senses the first resistance value R1 of the memory device 100. And then the processor 150 calculates the first time period $t_1$ according to the initial resistance value R0 of the memory device 100 and the first resistance value R1 of the memory device 100.

Specifically, the phase change memory is a two terminal device which stores data by controlling the microstructure of the phase-change materials: high resistance state (HRS) from the amorphous structure, and low resistance state (LRS) from the crystalline structure. Referring to FIG. 1, memory device 100 includes a top electrode 110, a bottom electrode 120, a phase change material 130, and a phase change region 140. And the resistance drift of a phase change memory follows a predictable pattern. For example, the resistance will first drift up (i.e. a structural relaxation stage), and then go down (i.e. a recrystallization stage) after a certain time period for a RESET state of the phase change memory. After a programming pulse, for example a RESET pulse, the resistance of the phase change memory will drift during an extended time period without power supply. The drifting of the resistance of a RESET state of the phase change memory typically follows a predicted model, for example resistance R=R0+A*log(t), where R0 is the resistance at time $t_0$, A is the drifting coefficient, and t is the elapsed time.

Figure 3:
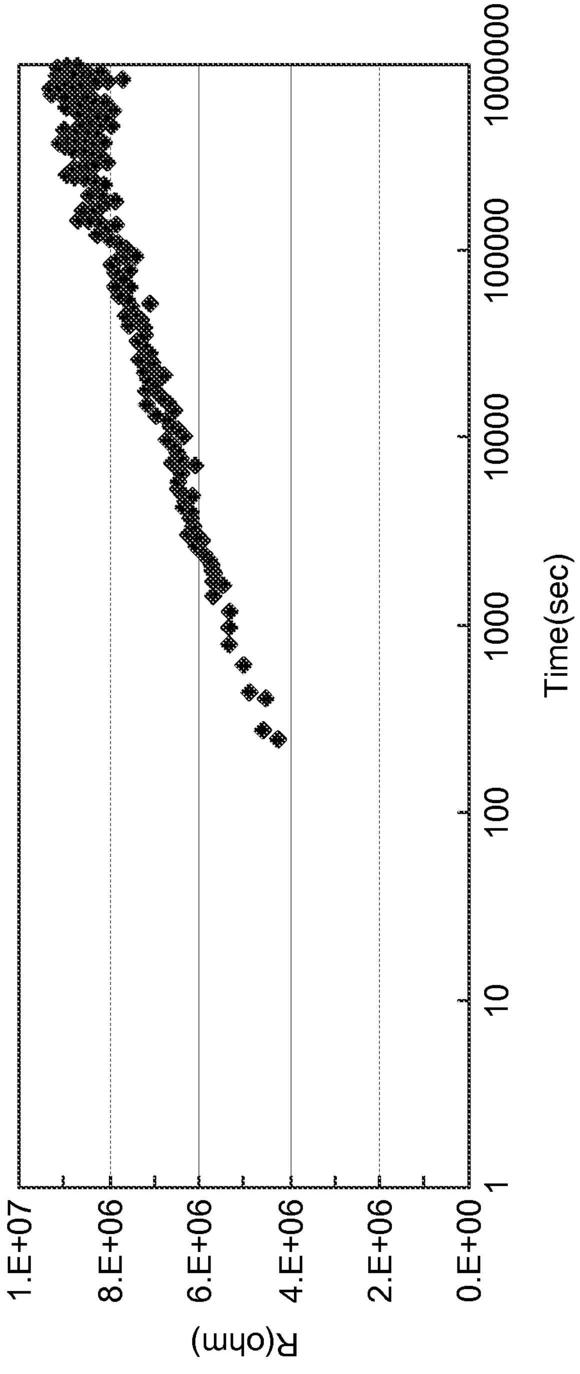
FIG. 3 shows an experiment result of the resistance of a GeSbTe phase change memory drifting with time after a RESET operation.

FIG. 3 shows an experiment result of the resistance of a GeSbTe phase change memory drifting with time after a RESET operation. Therefore, the elapsed time can be calculated by the above formula according to the initial resistance value R0 and the resistance value R after a period of time. And the timing device can be reset at any time. For example, the timing device may be reset by applying a RESET operation to the phase change memory, and in this case the drifting of the resistance will be return to R0, and therefore the timing device can start over again.

However, since the resistance of the phase change memory will goes down after a certain period of time, e.g. time $t_x$, we may not know the measured resistance value is corresponding to the time before or after time $t_x$. Thus, in some embodiments, the processor 150 determines whether the resistance value of the memory device 100 is larger than a first threshold Rth, e.g. 90% of the maximum resistance value Rmax, and when the resistance value of the memory device is larger than the first threshold, the processor 150 resets resistance value of the memory device 100 to the initial value R0.

Figure 4:
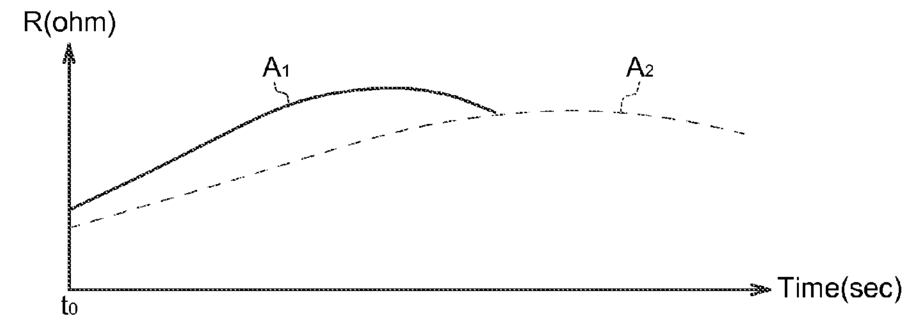
FIG. 4 shows a diagram of resistance of the phase change memory drifting with time for two kinds of compositions according to another embodiment of the present disclosure.

In some embodiments, the drifting coefficient A can be adjusted. FIG. 4 shows a diagram of resistance of the phase change memory drifting with time for two kinds of compositions according to another embodiment of the present disclosure. For example, the drifting coefficient of a GeSbTe phase change memory can be adjusted according to the composition ratio of Ge:Sb:Te, doping of the phase change material, the dimension of the phase change memory, the capping material over the phase change memory, the program algorithm (SET or RESET), and the resistance level at time $t_0$, etc. By adjusting the drifting coefficient of the phase change memory, the drifting resistance pattern of the phase change memory may change from $A_1$ to $A_2$. That is, the drifting resistance pattern of the $A_1$ can be adjusted to $A_2$, and the timing device may be sensed for longer time before it needs to be reset. On the other hand, the resistance pattern of the $A_2$ can be adjusted to $A_1$ so that the processor 150 may sense the timing device and calculate the elapsed time more accurately.

Figure 5:
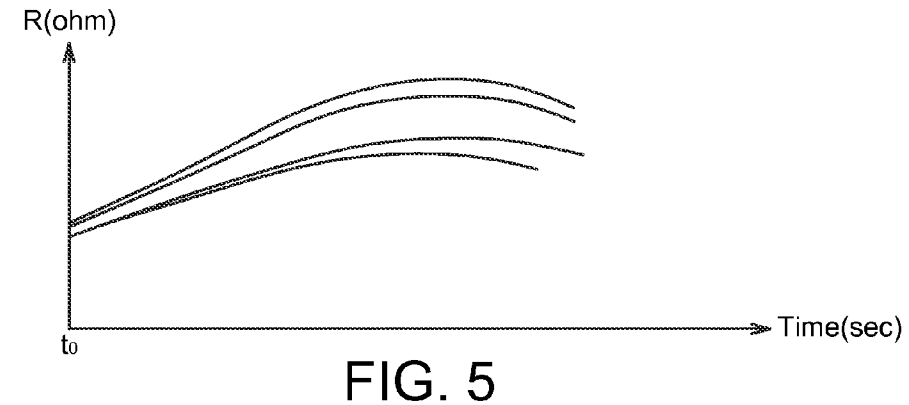
FIG. 5 shows a diagram of resistance of the multiple phase change memories drifting with time according to yet another embodiment of the present disclosure.

In some embodiments, the timing device may include multiple memory devices. FIG. 5 shows a diagram of resistance of the multiple phase change memories drifting with time according to yet another embodiment of the present disclosure. In this case, the processor 150 may sense multiple electrical parameters of all memories and calculate the time periods respectively to obtain more accurate elapsed time by averaging all calculated time periods.

Figure 6:
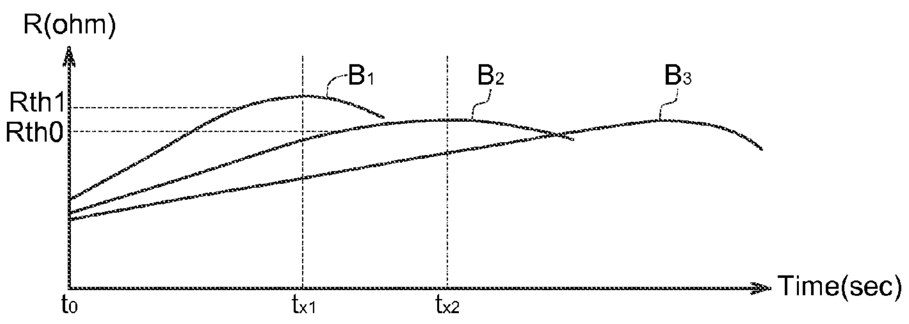
FIG. 6 shows a diagram of resistance of the three phase change memories with different drifting coefficient drifting with time according to another embodiment of the present disclosure.

Moreover, the timing device may include multiple memory devices with different drifting coefficient. FIG. 6 shows a diagram of resistance of the three phase change memories with different drifting coefficient drifting with time according to another embodiment of the present disclosure. In this case, the processor may know the resistance values are corresponding to the time before or after time $t_{x1}$ according to both the measured resistance value of the first memory device $B_1$ and the measured resistance value of a second memory device $B_2$. In some embodiments, the processor may determine whether the resistance value of the first memory device $B_1$ is larger than a first threshold $R_{th1}$, and when the resistance value of the first memory device $B_1$ is larger than the first threshold $R_{th1}$, the processor sense the resistance value of the second memory device $B_2$ after the first time period, and then calculate the first time period accordingly.

Furthermore, the timing device may further include a third memory device $B_3$. And the processor further determine whether the resistance value of the second memory device $B_2$ is larger than a second threshold $R_{th2}$, and when the resistance value of the second memory device $B_2$ is larger than the second threshold $R_{th2}$, the processor the resistance value of the third memory device $B_3$ after the first time period, and then calculate the first time period accordingly.

In some embodiments, the resistance of a SET state of the phase change memory may also drift with time in a predicted model. And the SET state of the phase change memory may also be used as a timing device.

In some embodiments, the memory device 100 may be an oxide resistance change device, a conductive bridge device, a floating-gate device, a charge trapping device, or any other memory devices having an electrical parameter that changes with time. And in some embodiments, the first electrical parameter may be a threshold voltage, a capacitance, an inductance, a number of charges in a capacitor, or any other electrical parameters that changes with time. And the processor may sense an initial value of one of the electrical parameter stated above of the memory device and then sense a first value of the electrical parameter of the memory device after the first time period. And accordingly, the processor calculates the first time period according to the initial value of the first electrical parameter of the memory device, the first value of the first electrical parameter of the memory device, the initial value of the second electrical parameter of the memory device, and the first value of the second electrical parameter of the memory device.

Figure 7:
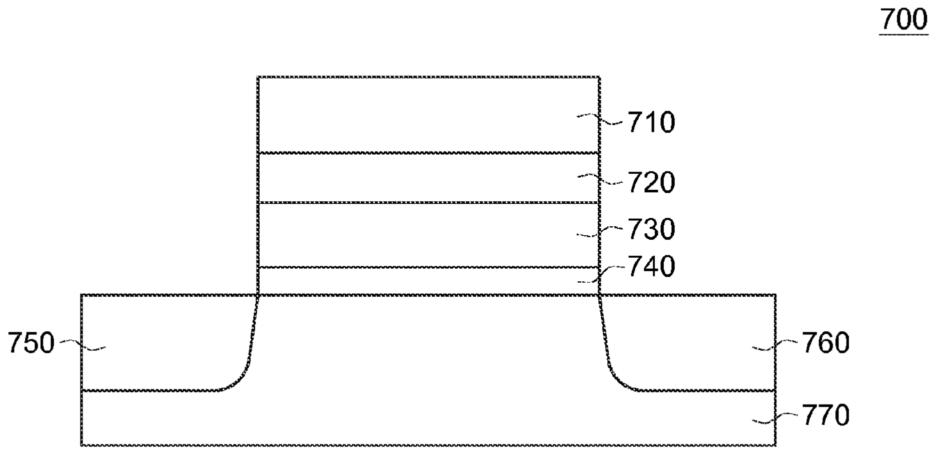
FIG. 7 shows a diagram of a timing device according to a second embodiment of the present disclosure.
Figure 8:
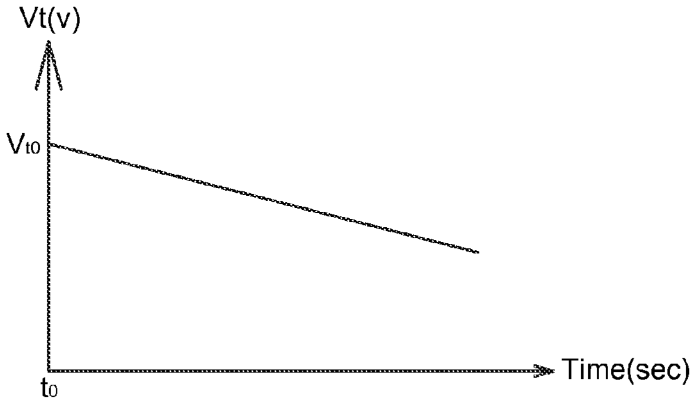
FIG. 8 shows a diagram of the threshold voltage Vt of the floating gate memory drifting with time according to the second embodiment of the present disclosure.

FIG. 7 shows a diagram of a timing device according to a second embodiment of the present disclosure. In this embodiment, the memory device is a floating gate memory 700. FIG. 8 shows a diagram of the threshold voltage Vt of the floating gate memory 700 drifting with time according to the second embodiment of the present disclosure. Specifically, floating gate memory 700 includes a control gate 710, an inter-poly dielectric 720, a floating gate 730, a tunnel oxide 740, a drain 750, a source 760 and a substrate 770. And the threshold voltage Vt drift of the floating gate memory also follows a predictable pattern.

Also, the drifting coefficient of the threshold voltage Vt of the floating gate memory can be adjusted. For example, the drifting coefficient of the floating gate memory can be adjusted according to the thickness of the tunnel oxide 740, the thickness and combination of the inter-poly dielectric 720, and the doping of the tunnel oxide 740, etc. And in this embodiment, the timing device may be reset by applying a hot-electron programming procedure to the floating gate memory, and in this case the drifting of threshold voltage Vt will be return to $Vt_0$ at time $t_0$.

Figure 9:
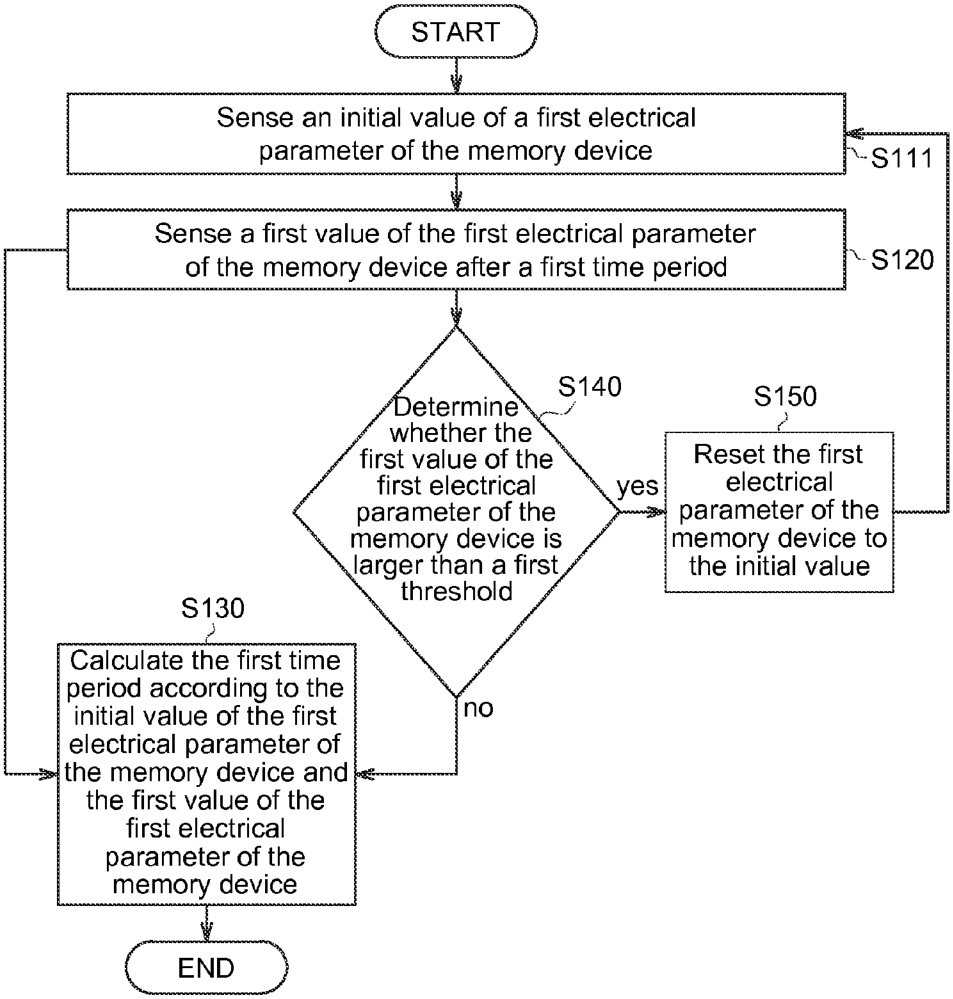
FIG. 9 shows a flow chart of a timing method using a memory device according to the first embodiment of the present disclosure.

FIG. 9 shows a flow chart of a timing method using a memory device according to the first embodiment of the present disclosure. The timing method using the memory device includes the following steps. Firstly, performing step S111 to sense an initial value of a first electrical parameter of the memory device. And then performing step S120 to sense a first value of the first electrical parameter of the memory device after a first time period. Finally, performing step S130 to calculate the first time period according to the initial value of the first electrical parameter of the memory device and the first value of the first electrical parameter of the memory device.

In some embodiments, the timing method performs step S140 to determine whether the first value of the first electrical parameter of the memory device is larger than a first threshold. If the answer is no, then performing step S130 to calculate the first time period. However, if the first value of the first electrical parameter of the memory device is larger than the first threshold, then performing step S150 to reset the first electrical parameter of the memory device to the initial value. And then repeat the step S111 to start over.

Figure 10:
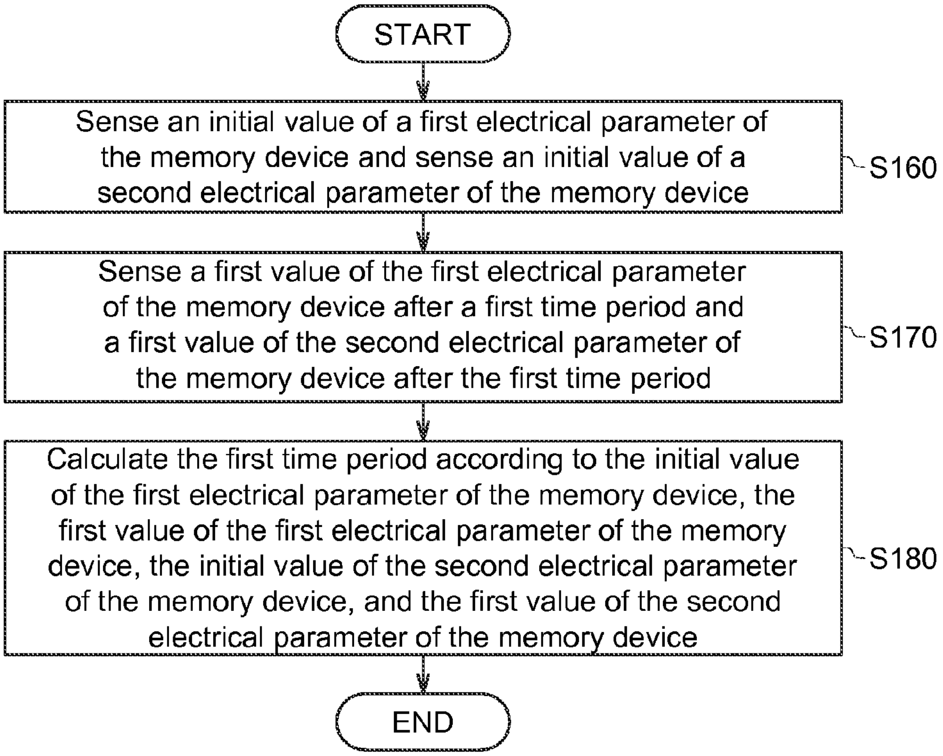
FIG. 10 shows a flow chart of another timing method using a memory device according to the first embodiment of the present disclosure.

In some embodiments, the timing method may sense a second electrical parameter of the memory device to calculate the elapsed time. FIG. 10 shows a flow chart of another timing method using a memory device according to the first embodiment of the present disclosure. Firstly, performing step S160 to sense an initial value of a first electrical parameter of the memory device and sense an initial value of a second electrical parameter of the memory device. And then performing step S170 to sense a first value of the first electrical parameter of the memory device after a first time period and a first value of the second electrical parameter of the memory device after the first time period. And then performing step S180 to calculate the first time period according to the initial value of the first electrical parameter of the memory device, the first value of the first electrical parameter of the memory device, the initial value of the second electrical parameter of the memory device, and the first value of the second electrical parameter of the memory device.

Figure 11:
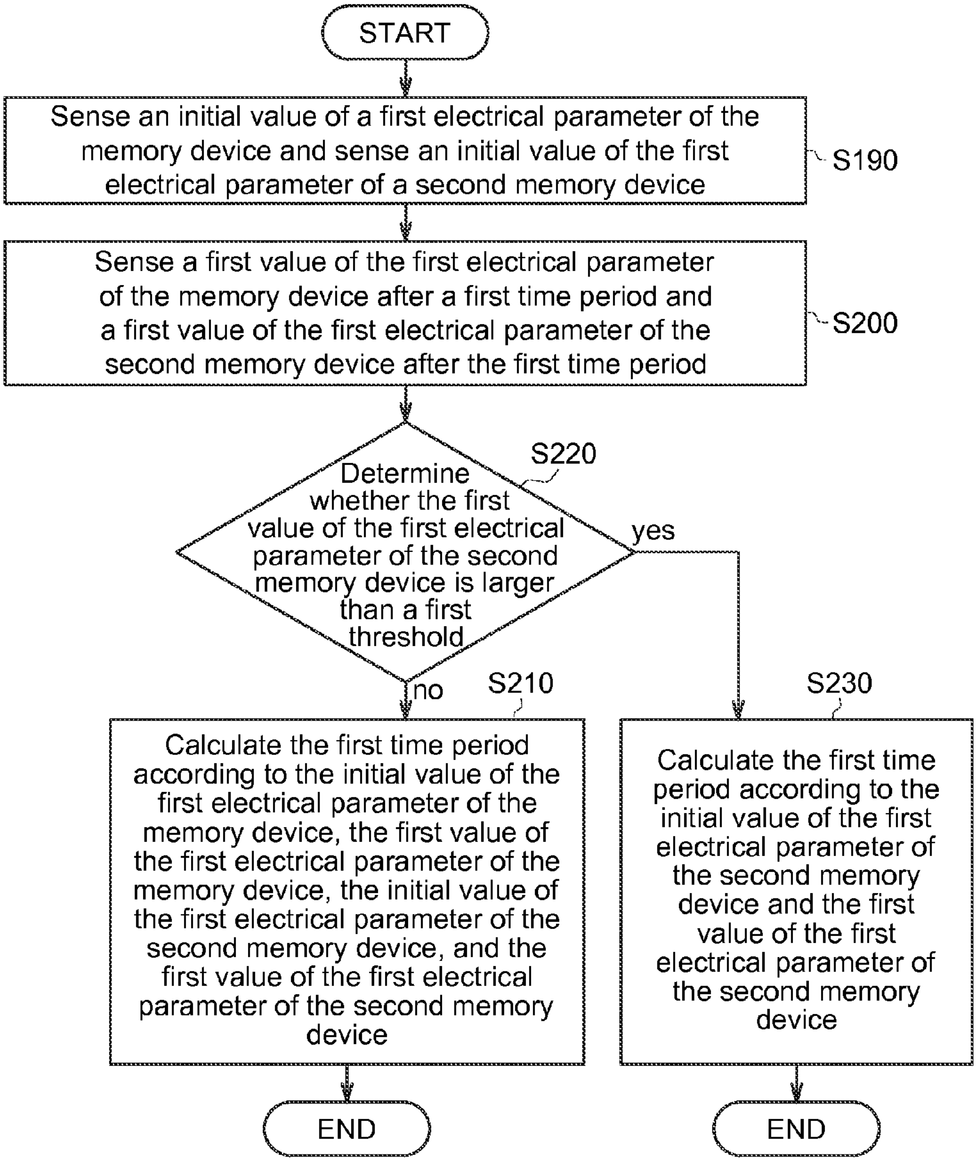
FIG. 11 shows a flow chart of yet another timing method using a memory device according to the first embodiment of the present disclosure.

In some embodiments, the timing method may further sense the first electrical parameter of a second memory device to calculate the elapsed time. FIG. 11 shows a flow chart of yet another timing method using a memory device according to the first embodiment of the present disclosure. Firstly, performing step S190 to sense an initial value of a first electrical parameter of the memory device and sense an initial value of the first electrical parameter of a second memory device. And then performing step S200 to And then performing step S210 to calculate the first time period according to the initial value of the first electrical parameter of the memory device, the first value of the first electrical parameter of the memory device, the initial value of the first electrical parameter of the second memory device, and the first value of the first electrical parameter of the second memory device.

And similar to step S140, the timing method may include step S220 to determine whether the first value of the first electrical parameter of the memory device is larger than a first threshold. If the answer is no, then performing step S210 to calculate the first time period. However, if the first value of the first electrical parameter of the memory device is larger than the first threshold, then performing step S230 to calculate the first time period according to the initial value of the first electrical parameter of the second memory device and the first value of the first electrical parameter of the second memory device. It is noted that the performing sequences as shown in FIG. 9, FIG. 10 and FIG. 11 may be performed repeatedly by design. And as described above, the above process can be performed repeatedly on more memory device and with different electrical parameters or with different types of memory devices.

According to the above embodiments, several timing devices and several timing methods are provided so that the elapsed time may be obtained without power supply to the timing device. And therefore the elapsed time can be measured easily even if the system including the timing device suffers from a power loss event. By using the timing methods described above, the power consumption of the system including the timing device may be reduced.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A timing device, comprising:

a memory device, having a first electrical parameter; and a processor is configured to:

sense an initial value of the first electrical parameter of the memory device;

sense a first value of the first electrical parameter of the memory device after a first time period; and calculate the first time period according to the initial value of the first electrical parameter of the memory device and the first value of the first electrical parameter of the memory device.

2. The timing device according to claim 1, wherein the processor is further configured to reset the first electrical parameter of the memory device to the initial value.

3. The timing device according to claim 1, wherein the processor is further configured to:

determine whether the first value of the first electrical parameter of the memory device is larger than a first threshold; and reset the first electrical parameter of the memory device to the initial value when the first value of the first electrical parameter of the memory device is larger than the first threshold.

4. The timing device according to claim 1, wherein the processor is further configured to:

sense an initial value of a second electrical parameter of the memory device;

sense a first value of the second electrical parameter of the memory device after the first time period; and calculate the first time period according to the initial value of the first electrical parameter of the memory device, the first value of the first electrical parameter of the memory device, the initial value of the second electrical parameter of the memory device, and the first value of the second electrical parameter of the memory device.

5. The timing device according to claim 1, further comprising:

a second memory device, having the first electrical parameter;

wherein the processor is further configured to:

sense an initial value of the first electrical parameter of the second memory device;

sense a first value of the first electrical parameter of the second memory device after the first time period; and calculate the first time period according to the initial value of the first electrical parameter of the memory device, the first value of the first electrical parameter of the memory device, the initial value of the first electrical parameter of the second memory device, and the first value of the first electrical parameter of the second memory device.

6. The timing device according to claim 1, further comprising:

a second memory device, having a second electrical parameter;

wherein the processor is further configured to:

sense an initial value of the second electrical parameter of the second memory device;

sense a first value of the second electrical parameter of the second memory device after the first time period; and calculate the first time period according to the initial value of the first electrical parameter of the memory device, the first value of the first electrical parameter of the memory device, the initial value of the second electrical parameter of the second memory device, and the first value of the second electrical parameter of the second memory device.

7. The timing device according to claim 1, further comprising:

a second memory device, having the first electrical parameter;

wherein the processor is further configured to:

sense an initial value of the first electrical parameter of the second memory device;

determine whether the first value of the first electrical parameter of the memory device is larger than a first threshold; and when the first value of the first electrical parameter of the memory device is larger than the first threshold:

sense a first value of the first electrical parameter of the second memory device after the first time period; and calculate the first time period according to the initial value of the first electrical parameter of the second memory device and the first value of the first electrical parameter of the second memory device.

8. The timing device according to claim 7, further comprising:

a third memory device, having the first electrical parameter;

wherein the processor is further configured to:

sense an initial value of the first electrical parameter of the third memory device;

determine whether the first value of the first electrical parameter of the second memory device is larger than a second threshold; and when the first value of the first electrical parameter of the second memory device is larger than the second threshold:

sense a first value of the first electrical parameter of the third memory device after the first time period; and calculate the first time period according to the initial value of the first electrical parameter of the third memory device and the first value of the first electrical parameter of the third memory device.

9. The timing device according to claim 1, wherein the memory device comprises a phase change memory device, an oxide resistance change device, a conductive bridge device, a floating-gate device and a charge trapping device.

10. The timing device according to claim 1, wherein the first electrical parameter is a resistance, a threshold voltage, a capacitance, an inductance, or a number of charges in a capacitor.

11. A timing method using a memory device, comprising:

sensing an initial value of a first electrical parameter of the memory device;

sensing a first value of the first electrical parameter of the memory device after a first time period; and calculating the first time period according to the initial value of the first electrical parameter of the memory device and the first value of the first electrical parameter of the memory device.

12. The timing method according to claim 11, further comprising:

resetting the first electrical parameter of the memory device to the initial value.

13. The timing method according to claim 11, further comprising:

determining whether the first value of the first electrical parameter of the memory device is larger than a first threshold; and resetting the first electrical parameter of the memory device to the initial value when the first value of the first electrical parameter of the memory device is larger than the first threshold.

14. The timing method according to claim 11, further comprising:

sensing an initial value of a second electrical parameter of the memory device;

sensing a first value of the second electrical parameter of the memory device after the first time period; and calculating the first time period according to the initial value of the first electrical parameter of the memory device, the first value of the first electrical parameter of the memory device, the initial value of the second electrical parameter of the memory device, and the first value of the second electrical parameter of the memory device.

15. The timing method according to claim 11, further comprising:

sensing an initial value of the first electrical parameter of a second memory device;

sensing a first value of the first electrical parameter of the second memory device after the first time period; and calculating the first time period according to the initial value of the first electrical parameter of the memory device, the first value of the first electrical parameter of the memory device, the initial value of the first electrical parameter of the second memory device, and the first value of the first electrical parameter of the second memory device.

16. The timing method according to claim 11, further comprising:

sensing an initial value of a second electrical parameter of a second memory device;

sensing a first value of the second electrical parameter of the second memory device after the first time period; and calculating the first time period according to the initial value of the first electrical parameter of the memory device, the first value of the first electrical parameter of the memory device, the initial value of the second electrical parameter of the second memory device, and the first value of the second electrical parameter of the second memory device.

17. The timing method according to claim 11, further comprising:

sensing an initial value of the first electrical parameter of a second memory device;

determining whether the first value of the first electrical parameter of the memory device is larger than a first threshold; and when the first value of the first electrical parameter of the memory device is larger than the first threshold:

sensing a first value of the first electrical parameter of the second memory device after the first time period; and calculating the first time period according to the initial value of the first electrical parameter of the second memory device and the first value of the first electrical parameter of the second memory device.

18. The timing method according to claim 17, further comprising:

sensing an initial value of the first electrical parameter of a third memory device;

determining whether the first value of the first electrical parameter of the second memory device is larger than a second threshold; and when the first value of the first electrical parameter of the second memory device is larger than the second threshold:

sensing a first value of the first electrical parameter of the third memory device after the first time period; and calculating the first time period according to the initial value of the first electrical parameter of the third memory device and the first value of the first electrical parameter of the third memory device.

19. The timing method according to claim 11, wherein the memory device comprises a phase change memory device, an oxide resistance change device, a conductive bridge device, a floating-gate device and a charge trapping device.

20. The timing method according to claim 11, wherein the first electrical parameter is a resistance, a threshold voltage, a capacitance, an inductance, or a number of charges in a capacitor.

* * * * *